(12) United States Patent
Coudrain et al.

(10) Patent No.: US 8,456,258 B2
(45) Date of Patent: Jun. 4, 2013

(54) BULK ACOUSTIC WAVE RESONATOR DISPOSED ON A SUBSTRATE HAVING A BURIED CAVITY FORMED THEREIN PROVIDING DIFFERENT SUBSTRATE THICKNESSES UNDERNEATH THE RESONATOR

(75) Inventors: Perceval Coudrain, Grenoble (FR); David Petit, Fontaine (FR)

(73) Assignee: STMicroelectronics S.A., Montrouge (FR)

( * ) Notice: Subject to any disclaimer, the term of this patent is extended or adjusted under 35 U.S.C. 154(b) by 292 days.

(21) Appl. No.: 12/783,095

(22) Filed: May 19, 2010

(65) Prior Publication Data
US 2010/0295631 A1 Nov. 25, 2010

(30) Foreign Application Priority Data
May 20, 2009 (FR) ....................... 09 53373

(51) Int. Cl.
*H03H 9/54* (2006.01)
(52) U.S. Cl.
USPC ............................. 333/187; 310/324; 310/349
(58) Field of Classification Search
USPC ............................. 333/187, 191; 310/324, 349
See application file for complete search history.

(56) References Cited

U.S. PATENT DOCUMENTS

| 6,870,445 B2* | 3/2005 | Kawakubo et al. ........... 333/187 |
| 2004/0012463 A1 | 1/2004 | Kawakubo et al. |
| 2006/0017352 A1* | 1/2006 | Tanielian ..................... 310/324 |

FOREIGN PATENT DOCUMENTS
EP 1291317 A2 3/2003

OTHER PUBLICATIONS

French Search Report dated Jan. 8, 2010 from corresponding French Application No. 09/63373, filed May 20, 2009.
Thalhammer et al., "Spurious mode suppression in BAW resonators", 2006 IEEE Ultrasonics Symposium, 1051-0117/06, pp. 456-459.

* cited by examiner

*Primary Examiner* — Benny Lee
(74) *Attorney, Agent, or Firm* — Wolf, Greenfield & Sacks, P.C.

(57) ABSTRACT

A resonant device including a stack of a first metal layer, a piezoelectric material layer, and a second metal layer formed on a silicon substrate, a cavity being formed in depth in the substrate, the thickness of the silicon above the cavity having at least a first value in a first region located opposite to the center of the stack, having a second value in a second region located under the periphery of the stack and having at least a third value in a third region surrounding the second region, the second value being greater than the first and the third values.

12 Claims, 3 Drawing Sheets

BULK ACOUSTIC WAVE RESONATOR DISPOSED ON A SUBSTRATE HAVING A BURIED CAVITY FORMED THEREIN PROVIDING DIFFERENT SUBSTRATE THICKNESSES UNDERNEATH THE RESONATOR

CROSS REFERENCE TO RELATED APPLICATIONS

This application claims the priority benefit of French patent application Ser. No. 09/53373, filed on May 20, 2009, entitled "BULK ACOUSTIC WAVE RESONATOR AND METHOD FOR MANUFACTURING SAID RESONATOR," which is hereby incorporated by reference to the maximum extent allowable by law.

BACKGROUND OF THE INVENTION

1. Field of the Invention

The present invention relates to a piezoelectric bulk acoustic wave resonator and to its manufacturing method.

2. Discussion of the Related Art

Piezoelectric bulk acoustic wave (BAW) resonators are generally used to form filters or resonant elements. They may, in particular, be used in devices ensuring time or frequency reference functions (for example, temperature compensated X-Tal (crystal) oscillators, TCXOs).

A BAW resonator includes a layer of a piezoelectric material sandwiched between two metal electrodes. The electrodes are generally made of molybdenum, tungsten, aluminum, or platinum. When an electric excitation is applied between its two electrodes, the piezoelectric layer expands or shrinks widthwise. Mechanical vibrations are thus generated in the piezoelectric layer, such vibrations themselves creating an electric signal. The fundamental resonance of the system is observed when the mechanical vibrations and the induced electric field generate a constructive wave, thus optimizing the transfer power between the two vibrations.

To obtain BAW resonators with significant quality (Q) and electromagnetic coupling ($Kt^2$) factors, it is generally provided to isolate these resonators from the substrate on which they are formed. This isolation confines the acoustic power in the resonator. To perform this isolation, two structures are known: the resonator may be suspended above a recess or it may be formed on an acoustic mirror (also called Bragg mirror). A disadvantage of a Bragg mirror is the multiplicity of the operations necessary to manufacture it.

FIG. 1 illustrates an example of a resonator suspended above a recess. This type of resonator, formed on a thin film, is currently called FBAR (film bulk acoustic resonator), TFBAR (thin film bulk acoustic resonator) or TFR (thin film resonator).

A membrane 12, for example, made of silicon nitride, is formed on a silicon substrate 10. Membrane 12 is separated from substrate 10 at its center by a recess 14, while its periphery is in contact with substrate 10. A stack 16 forming the resonant device is formed on the portion of membrane 12 distant from the substrate (above recess 14). Stack 16 comprises a first conductive layer 18 forming the first metal electrode of the resonator, a piezoelectric material region 20, and a second conductive layer 22 forming the second electrode of the resonator. It should be noted that, in this drawing and in the following ones, the contact recoveries on first and second electrodes 18 and 22 are not shown.

A disadvantage of a structure such as shown in FIG. 1 is the complexity of its manufacturing process. Indeed, to form suspended membrane 12, a sacrificial layer is formed under this membrane, after which this layer is removed. Other known variations enable forming a cavity under the resonant stack. One of them comprises forming an opening at the surface of the substrate, after which the resonant stack is formed on a planar intermediary layer extending over the substrate. This method has the disadvantage of requiring to form the intermediary layer on the substrate. Another variation comprises forming the resonator directly on the substrate and etching a portion thereof from its surface opposite to the resonator. However, this solution is typically possible only in the case of a relatively thin substrate and cannot be adapted to solid substrates.

Further, a disadvantage of resonant devices of finite dimensions such as that in FIG. 1 is that spurious acoustic modes form in the resonator, which alter the quality factor. A known method to characterize a resonant device is to draw its "dispersion curve", which illustrates such spurious acoustic modes. Two types of curves can be distinguished, "type-I" dispersion curves in the case where the resonance frequency of the second harmonic of the transverse mode is lower than the resonance frequency of the longitudinal mode, and "type II" dispersion curves in the case where the resonance frequency of the second harmonic of the transverse mode is higher than the resonance frequency of the longitudinal mode.

According to the piezoelectric material used or to the resonator stack, the dispersion curves may be of type I or of type II. A known method to prevent the forming of spurious acoustic modes is to form a rigid frame at the periphery of the external surface of the resonant device. This technique is disclosed, in the case of dispersion curves of type I and II, in the publication entitled "Spurious mode suppression in BAW resonators", by Robert Thalhammer et al., IEEE 2006, 1054-0117/06.

FIG. 2 illustrates a first example of such a resonant device, in the case where the piezoelectric material, or the entire resonant element, has a type-I dispersion curve. Such a piezoelectric material, for example, is zinc oxide.

The resonator comprises a stack 16 (first conductive layer 18, piezoelectric layer 20, and second conductive layer 22) formed on a support 24, for example, a Bragg mirror or an upper membrane. To avoid the generation of parasitic acoustic modes at the periphery of stack 16, a frame 26, for example made of silicon oxide, is formed at the surface of stack 16 over the entire periphery thereof. Frame 26 ensures the fitting between the active area of the resonator and its outer part.

FIG. 3 illustrates a second example of a resonant device in the case where the piezoelectric material or the entire resonant element has a type-II dispersion curve. Such a piezoelectric material, for example, is aluminum nitride.

The resonator comprises a stack 16 similar to that of FIG. 2 (first conductive layer 18, piezoelectric layer 20, and second conductive layer 22), formed on a support 24, for example a Bragg mirror or a suspended membrane. A frame 26, for example made of silicon oxide, enabling to attenuate the spurious acoustic modes at the periphery of stack 16, is formed at the periphery of the surface of stack 16. In this device, the thickness of second conductive layer 22 is decreased in a region 28 forming, in top view, a frame in internal contact with peripheral frame 26.

A disadvantage of the devices disclosed in FIGS. 2 and 3 is that their upper surfaces are strongly marked (topology) due to the presence of frame 26 at the surface of stack 16. Further, the forming of frame 26 needs at least one deposition step and one etch step, in addition to the resonant stack forming steps.

SUMMARY OF THE INVENTION

An object of an embodiment of the present invention is to provide a resonant device overcoming at least some of the disadvantages of known resonant devices.

Another object of an embodiment of the present invention is to provide a device having a significant quality factor over a significant frequency band.

Another object of an embodiment of the present invention is to provide a simple method for manufacturing such a resonant device.

Thus, an embodiment of the present invention provides a resonant device comprising a stack of a first metal layer, a piezoelectric material layer, and a second metal layer formed on a silicon substrate, a cavity being formed in depth in the substrate, the thickness of the silicon above the cavity having at least a first value in a first region located opposite to the center of the stack having a second value in a second region located under the periphery of the stack and having at least a third value in a third region surrounding the second region, the second value being greater than the first and the third values.

According to an embodiment of the present invention, the resonant element has a type-I dispersion curve.

According to an embodiment of the present invention, the piezoelectric material is zinc oxide.

According to an embodiment of the present invention, the silicon thickness above the cavity has a fourth value in a fourth region located between the first and second regions, the fourth value being smaller than the first value.

According to an embodiment of the present invention, the resonant element has a type-II dispersion curve.

According to an embodiment of the present invention, the piezoelectric material is aluminum nitride.

According to an embodiment of the present invention, the stack further comprises a compensation layer having a temperature coefficient opposite to that of the piezoelectric material.

An embodiment of the present invention further provides a method for forming a resonant device, comprising the steps of:

forming, in a silicon substrate, a first regular set of openings in a first region of the substrate, a second regular set of openings in a second region of the substrate surrounding the first region, and a third regular set of openings in a third region of the substrate surrounding the second region, the ratio between the cross-section of the openings and the step between the openings of the second set being smaller than the same ratio of the first and third assemblies;

annealing the structure, whereby a buried cavity forms in the substrate, with an upper surface at different depths; and forming, on the substrate, opposite to the cavity portion associated with the first and second sets of openings, a stack of a first metal layer, of a piezoelectric material layer, and of a second metal layer.

According to an embodiment of the present invention, a fourth regular set of openings is formed in the substrate, between the first and second sets of openings, the ratio between the cross-section of the openings and the step between the openings of the fourth set being greater than that of the first set.

According to an embodiment of the present invention, the structure is annealed under hydrogen at a temperature greater than 1,100° C.

The foregoing objects, features, and advantages of the present invention will be discussed in detail in the following non-limiting description of specific embodiments in connection with the accompanying drawings.

DETAILED DESCRIPTION

Figure 1:
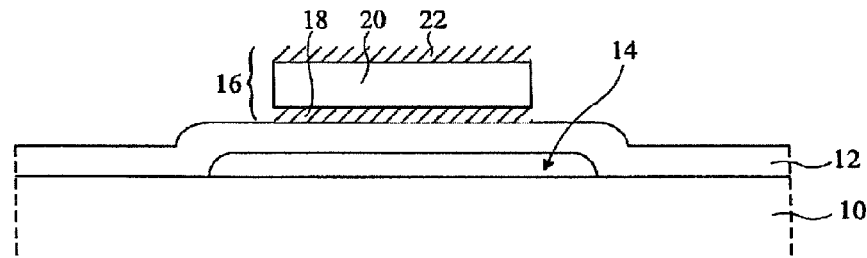
FIG. 1, previously described, illustrates an example of a resonant device formed on a suspended membrane.

For clarity, the same elements have been designated with the same reference numerals in the different drawings and, further, as usual in the representation of integrated circuits, the various drawings are not to scale.

Figure 4:
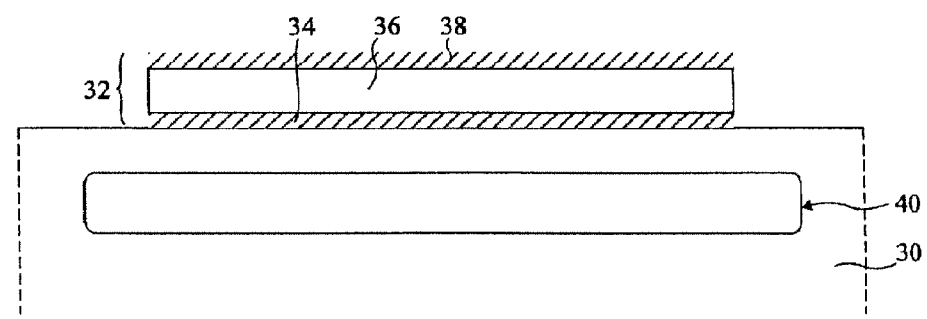
FIG. 4 illustrates a first embodiment of a resonant device.

FIG. 4 illustrates a first embodiment of a resonant device.

On a silicon substrate 30 is formed a resonant stack 32 comprising a first conductive layer 34 forming a first electrode, a region of a piezoelectric material 36, and a second conductive layer 38 forming a second electrode. In silicon substrate 30, deep under stack 32, is formed a buried cavity 40. Cavity 40 extends at least opposite to stack 32. It may also extend over a surface area slightly larger than the surface area taken up by stack 32. It should be noted that, in this drawing and in the following ones, the contacts on first and second electrodes 34 and 38 are not shown.

Cavity 40 exhibits a perfect sound reflection. Thus, all the acoustic waves are reflected at the level of the interface between substrate 30 and cavity 40. An acoustic wave reflection with as good a quality as in FBAR-type devices is thus advantageously obtained, and this, whatever the frequency of the considered acoustic waves. To form cavity 40, it is provided to take advantage of ESS (empty space in silicon) methods, as will be described in further detail hereafter.

Figure 5:
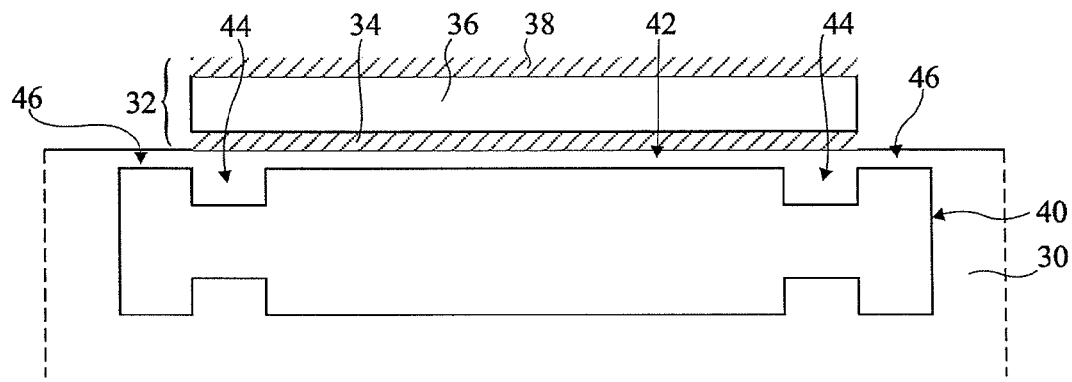
FIG. 5 illustrates a second embodiment of a resonant device.

FIG. 5 illustrates a second embodiment of a resonant device in the case of a resonator having a type-I dispersion curve.

The resonant device comprises elements similar to the device of FIG. 4, that is, a stack 32, formed on a silicon substrate 30, comprising a first conductive layer 34, a piezoelectric material layer 36, and a second conductive layer 38. The difference with the device of FIG. 4 lies in the shape of buried cavity 40 formed in substrate 30. In this embodiment cavity 40 extends on a surface area slightly larger than the surface area taken up by stack 32.

Cavity 40 is provided so that the silicon located above it has different thicknesses. It comprises a first region 42, located opposite to the center of resonant stack 32, a second region 44 located, under stack 32, opposite to its periphery, and a third region 46 located opposite to the external contour of stack 32. The thickness of region 42 is smaller than the thickness of region 44 and the thickness of region 46 is smaller than the thickness of region 44.

Figure 2:
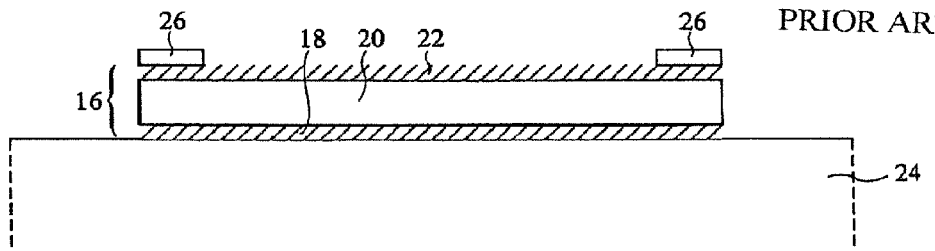
FIG. 2, previously described, illustrates a known structure enabling to attenuate spurious modes in a resonator.

The inventors have shown that a structure such as that in FIG. 5, where the silicon between resonant stack 32 and cavity 40 has different thicknesses, enables a matching of spurious acoustic modes in the resonator similar to that provided by a frame formed at the resonator surface, as in the device of FIG. 2. Further, the integration of the elements ensuring the adaptation of the spurious acoustic modes directly in the cavity enables to decrease the complexity of the upper surface of the device (topology).

In the shown example, regions 42 and 46 have identical thicknesses. It should be noted that this is an embodiment only. Further, cavity 40 is shown as being symmetrical with respect to a central plane parallel to the upper surface of substrate 30. It should be noted that only the upper limit of the cavity matters for the operation of the device, and the lower limit of the cavity may have any other shape.

Figure 6:
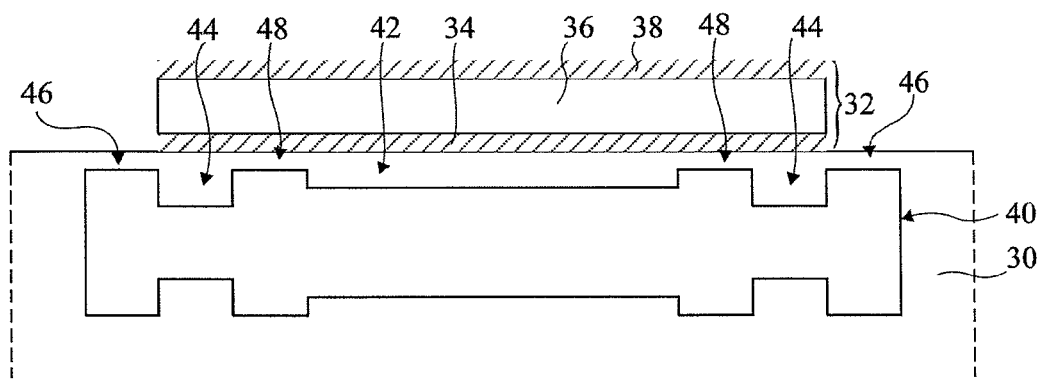
FIG. 6 illustrates a third embodiment of a resonant device.

FIG. 6 illustrates a third embodiment of a resonant device in the case of a resonator having a type-II dispersion curve.

The substrate located under cavity 40 comprises four regions. The first three regions 42, 44, and 46 are respectively similar to the regions of same reference numerals in FIG. 5, and are respectively located opposite to a central portion of stack 32, opposite to the periphery of the stack, and opposite to an external contour of the stack. A further region 48 of the substrate is formed, opposite to stack 32, between the first and second regions, the thickness of fourth region 48 having a lower value than the thickness of the first region.

Figure 3:
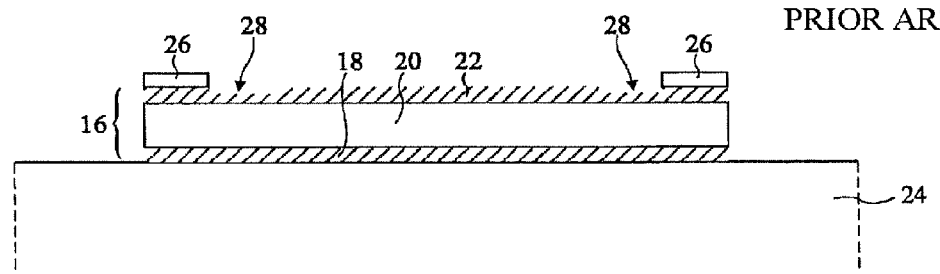
FIG. 3 previously described, illustrates another known structure enabling to attenuate spurious modes in another resonator.

In the same way as in the case of FIG. 5, the inventors have shown that a structure such as that of FIG. 6 provides advantages identical to those of the structure of FIG. 3, regarding the attenuation of spurious modes.

Figure 7A:
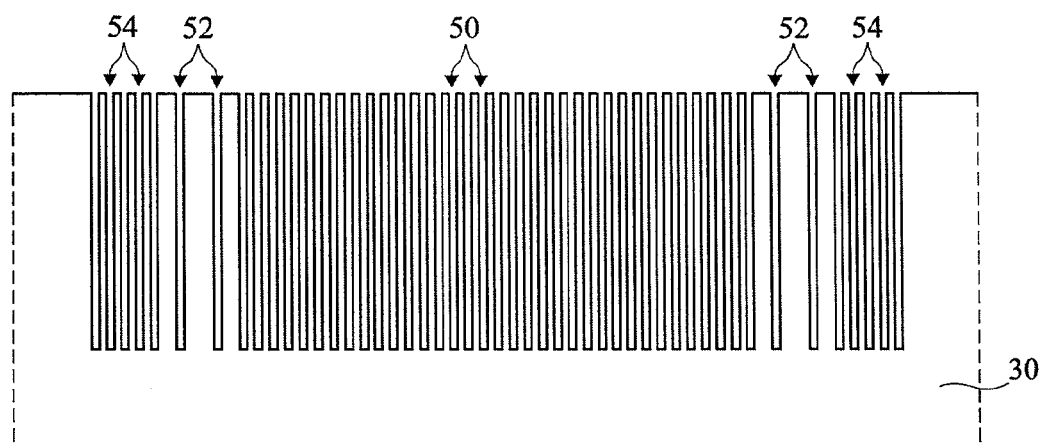
FIGS. 7A to 7D illustrate steps of the manufacturing of the resonant device of FIG. 5.
Figure 7B:
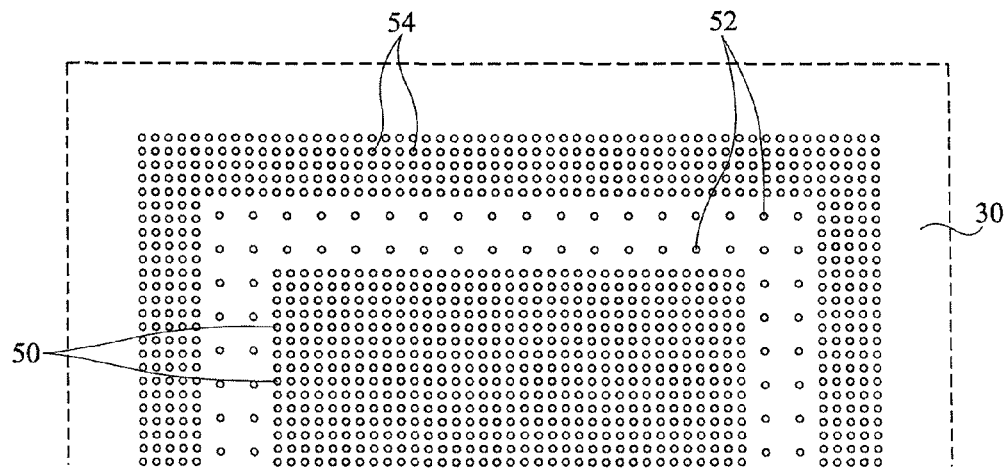

FIGS. 7A to 7D illustrate steps of the manufacturing of the resonant device of FIG. 5, FIG. 7B being a partial top view of the device shown in cross-section view in FIG. 7A.

As illustrated in FIGS. 7A and 7B, it is started from a silicon substrate 30 in which several regular sets of non-through openings 50, 52, and 54 are formed. As can be seen in FIG. 7B, the set of openings 50 is formed in a central region of substrate 30, the set of openings 52 is formed around the set of openings 50, and the set of openings 54 is formed around the set of openings 52. It should be noted that, unlike what is shown in the drawings, the set of openings 50 preferably takes up the greatest proportion of the space taken up by the different sets of openings.

In each set of openings, openings 50, 52, and 54 are regularly distributed at the substrate of silicon substrate 30. In the shown example, openings 50, 52, and 54 have identical diameters but the step between the openings of the different sets varies, the step between openings 52 being greater than the steps between openings 50 and 54. Further, as an example, the steps between openings 50 and 54 are shown to be equal.

Figure 7C:
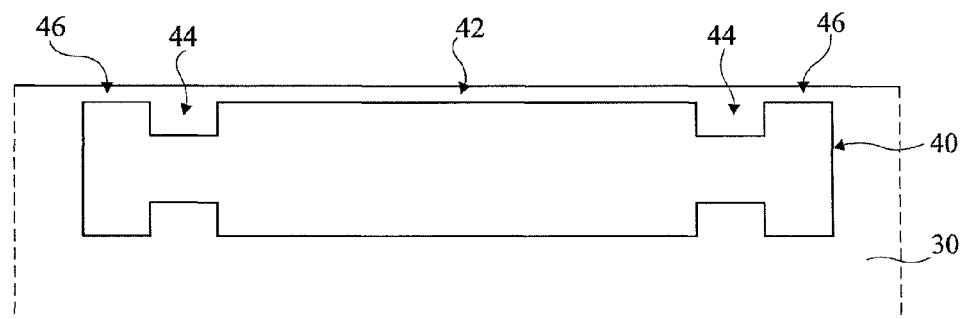

At the step illustrated in FIG. 7C, the structure of FIGS. 7A and 7B has been annealed. This anneal is performed at a temperature greater than 1,100° C., under a hydrogen flow, for example for a few hundreds of seconds. It enables obtaining, in silicon substrate 30, a buried cavity 40 having its upper surface at different levels in substrate 30. This level difference is linked to the step difference between openings 50, 52, and 54, as illustrated in FIGS. 7A and 7B.

For openings 50, 52, and 54 to close in the substrate depth and to form cavity 40, the ratio between the step of the openings and the diameter of the openings is selected to be smaller than a given threshold which will be easily determined by those skilled in the art for silicon of given orientation and doping. Thus, by varying the depth, the cross-section, and/or the step of the openings, a cavity 40 having its upper limit at desired depths in substrate 30 is obtained.

In the shown example, the step of openings 50 and 54 is smaller than the step of openings 52 for equal cross-sections. This enables to form a cavity 40 in which the substrate thickness above cavity 40 is small in a central region 42 (at the level of the set of openings 50) and in a peripheral region 46 of the device (at the level of the set of openings 54), and higher in an intermediary region 44 of the device, between the central and peripheral regions (at the level of the set of openings 52).

Generally, for regions 42 and 46 to be thinner than region 44, the ratio between the cross-section of the openings and the step between openings of the second set must be smaller than the same ratio for the openings of the first and third sets.

As an example of numerical values, in the case where the step between openings 50, 52, and 54 is the same (for example, 0.7 µm) and where the cross-section of openings 50, 52, and 54 varies, the following values may be selected:
diameter of openings 50 and 54=0.5 µm;
depth of openings 50 and 54=3 µm;
diameter of openings 52=0.35 µm; and
depth of openings 52=3 µm.

With these values, a cavity 40 having a virtually planar lower limit, regions 42 and 46 having a thickness on the order of 0.8 µm and a region 44 having a thickness on the order of 1.2 µm, are obtained. These values are particularly appropriate for the forming of the device of FIG. 5.

It should be noted that varying the step, the cross-section, and the depth of openings 50, 52, and 54 enables to obtain a cavity 40 of any desired shape, for different adaptations of the resonant devices.

Figure 7D:
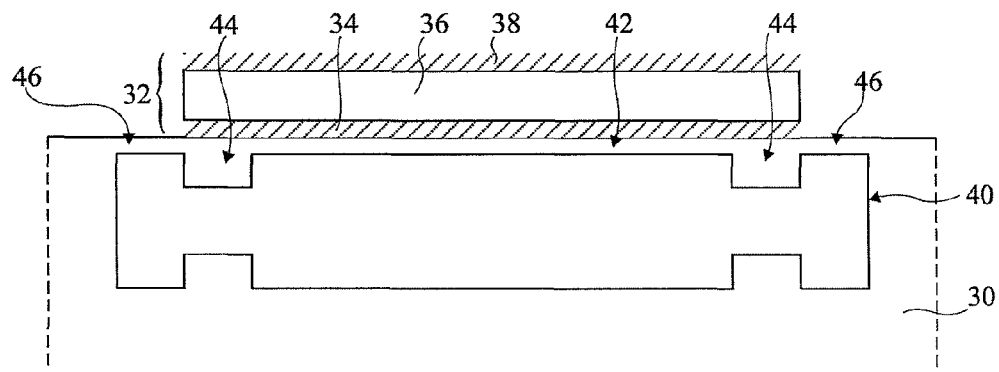

At the step illustrated in FIG. 7D, a resonant stack 32 has been formed on the structure of FIG. 7C above silicon regions 42 and 44. The stack comprises a first metal layer 34, a piezoelectric material layer 36, and a second metal layer 38. Stack 32 may be formed by any known method, for example, by depositing layers of conductive and piezoelectric materials over the entire substrate, and then etching these layers as appropriate. Thus, the device of FIG. 5 is obtained. The method disclosed herein advantageously enables forming cavity 40 and elements enabling to attenuate spurious modes in a single step. The number of steps to be carried out thus is relatively small. It should be noted that a step of polishing of the surface of substrate 30 may be provided, after the forming of cavity 40 (step of FIG. 7C), to ensure the flatness of the upper surface of the substrate.

Similarly, to obtain the device of FIG. 6, the forming of a set of additional openings in substrate 30 will be provided at the step of FIG. 7A, between the first and second sets of openings 50 and 52. The ratio between the cross-section and the step of the openings of the additional set of openings will be selected so that the cavity formed at the step of FIG. 7C has a shallower upper limit than region 42, that is, greater than this same ratio for openings 50.

Thus, advantageously, the method disclosed herein enables, in a single anneal step, to form a cavity 40 under a bulk acoustic wave resonator, exhibiting a specific shape enabling to attenuate spurious modes and thus to obtain resonators having significant quality factors over a significant frequency band.

It should be noted that the characteristic frequencies of a bulk acoustic wave resonator may vary according to temperature. To avoid this frequency drift, the forming of a compensation layer in the resonant stack may be provided. This compensation layer will be provided with a temperature coefficient opposite to that of the piezoelectric material, to go against the frequency drift of the resonator. It should be noted that one electrode, or both electrodes, may themselves be provided to perform this compensation.

Specific embodiments of the present invention have been described. Various alterations and modifications will occur to those skilled in the art. In particular, openings 50, 52, and 54 have been shown as having circular cross-sections. As a variation, these openings may have any desired cross-section. Further, generally, several resonant devices are formed in parallel on a same substrate. In this case, it may be provided to form a single buried cavity in the substrate for several resonant elements, the upper portion of the cavity being at depths adapted accordingly.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A resonant device comprising a stack of a first metal layer, a piezoelectric material layer, and a second metal layer formed on a silicon substrate, a buried cavity being formed in the substrate, a thickness of a region of the substrate above the cavity having at least a first value in a first region located opposite to the center of the stack, having a second value in a second region located under the periphery of the stack and having at least a third value in a third region surrounding the second region, the second value being greater than the first and the third values.

2. The resonant device of claim 1, wherein the stack has a type-I dispersion curve.

3. The resonant device of claim 1, wherein the piezoelectric material layer is zinc oxide.

4. The resonant device of claim 1, wherein the thickness of the region of the substrate above the cavity has a fourth value in a fourth region located between the first and second regions, the fourth value being smaller than the first value.

5. The device of claim 4, wherein the stack has a type-II dispersion curve.

6. The device of claim 4, wherein the piezoelectric material layer is aluminum nitride.

7. The device of claim 1, wherein the first metal layer and/or the second metal layer has a temperature coefficient opposite to a temperature coefficient of the piezoelectric material.

8. A resonant device comprising:
   a substrate; and
   a resonant stack formed on the substrate, the substrate having a buried cavity below the resonant stack, a thickness of the substrate between the buried cavity and the resonant stack being different in different regions, wherein different thicknesses of the substrate between the buried cavity and the resonant stack are defined by a shape of the buried cavity.

9. A resonant device as defined in claim 8, wherein the different thicknesses of the substrate between the buried cavity and the resonant stack include a first value in a first region under a center of the stack, include a second value in a second region under a periphery of the resonant stack and include a third value in a third region surrounding the second region.

10. A resonant device as defined in claim 9, wherein the second value is greater than the first and third values.

11. A resonant device as defined in claim 10, wherein the different thicknesses of the substrate between the buried cavity and the resonant stack include a fourth value in a fourth region between the first and second regions, the fourth value being less than the first value.

12. A resonant device as defined in claim 8, wherein the resonant stack includes a piezoelectric layer between first and second conductive layers.

\* \* \* \* \*